United States Patent
Zheng et al.

(10) Patent No.: US 8,492,699 B2
(45) Date of Patent: Jul. 23, 2013

(54) PHOTODETECTORS USEFUL AS AMBIENT LIGHT SENSORS HAVING AN OPTICAL FILTER REJECTING A PORTION OF INFRARED LIGHT

(75) Inventors: Dong Zheng, San Jose, CA (US); Xijian Lin, Fremont, CA (US); Joy Jones, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 359 days.

(21) Appl. No.: 12/885,297

(22) Filed: Sep. 17, 2010

(65) Prior Publication Data
US 2011/0068255 A1  Mar. 24, 2011

Related U.S. Application Data (60) Provisional application No. 61/244,817, filed on Sep. 22, 2009, provisional application No. 61/259,475, filed on Nov. 9, 2009, provisional application No. 61/257,595, filed on Nov. 3, 2009.

(51) Int. Cl.
G01J 1/44 (2006.01)
H01J 5/16 (2006.01)
H03F 3/08 (2006.01)

(52) U.S. Cl.
USPC .......... 250/214 AL; 250/226; 250/214 R (58) Field of Classification Search
USPC ......... 250/226, 239, 216, 214 R, 214 AL, 250/214 C; 257/440, 290, 291, 428, 257, 257/258, 431, 432; 348/272, 273, 276, 277, 348/278, 279, 280
See application file for complete search history.

(56) References Cited

U.S. PATENT DOCUMENTS 4,096,512 A  6/1978 Polinsky
4,913,846 A  4/1990 Suzuki et al.
(Continued)

FOREIGN PATENT DOCUMENTS

EP  97870061.5  4/1997
EP  0 875 939 A1  4/1998
(Continued)

OTHER PUBLICATIONS

Winkelmann et al., "DOE-2 Supplement", Version 2.1E, Lawrence Berkeley Laboratory, Berkeley, CA. 94720; pp. 1.1 to 1.9., Dec. 1993.

(Continued)

Primary Examiner — Pascal M Bui Pho
Assistant Examiner — Jennifer Bennett
(74) Attorney, Agent, or Firm — Vierra Magen Marcus LLP (57) ABSTRACT

A photodetector includes one or more first photodiode regions that are covered by an optical filter configured to reject infrared (IR) light and that produce a first current ($I_1$). The photodetector also includes one or more second photodiode regions that are covered by a light blocking material configured to reject visible and infrared light and that produce a second current ($I_2$). The photodetector also includes one or more third photodiode regions that are not covered by the optical filter and are not covered by the light blocking material and that produce a third current ($I_3$). Additionally, the photodetector includes circuitry configured to produce an output indicative of the first current ($I_1$) or a scaled version of the first current ($I_1$), minus the second current ($I_2$) or a scaled version of the second current ($I_2$), minus the third current ($I_3$) or a scaled version of the third current ($I_3$). The optical filter configured to reject IR light can be, e.g., a dielectric reflective optical coating filter, an IR absorption optical coating filter, or a combination thereof.

12 Claims, 9 Drawing Sheets

U.S. PATENT DOCUMENTS

| | | | |
|---|---|---|---|
| 4,937,450 A * | 6/1990 | Wakabayashi et al. | 250/352 |
| 5,130,775 A | 7/1992 | Maeda et al. | |
| 5,686,639 A | 11/1997 | Cohen | |
| 5,753,375 A | 5/1998 | Ray | |
| 5,801,373 A | 9/1998 | Oozu et al. | |
| 6,157,035 A | 12/2000 | Kuijk et al. | |
| 6,211,521 B1 | 4/2001 | Bawolek et al. | |
| 6,218,719 B1 | 4/2001 | Tsang | |
| 6,596,981 B1 | 7/2003 | Aswell et al. | |
| 6,724,063 B2 | 4/2004 | Kuhara et al. | |
| 6,737,718 B2 | 5/2004 | Takeuchi | |
| 6,743,652 B2 | 6/2004 | Thomas et al. | |
| 6,825,470 B1 | 11/2004 | Bawolek et al. | |
| 6,830,951 B2 | 12/2004 | Laurin et al. | |
| 6,998,207 B2 | 2/2006 | Yaung | |
| 7,163,832 B2 | 1/2007 | Kim | |
| 7,394,059 B2 | 7/2008 | Fukuyoshi et al. | |
| 7,485,486 B2 | 2/2009 | Zheng et al. | |
| 8,045,033 B2 * | 10/2011 | Honda et al. | 348/308 |
| 2002/0017612 A1 | 2/2002 | Yu et al. | |
| 2002/0047174 A1 | 4/2002 | De Pauw et al. | |
| 2004/0089790 A1 | 5/2004 | Rubin et al. | |
| 2004/0184173 A1 | 9/2004 | Kobayashi et al. | |
| 2005/0041292 A1 | 2/2005 | Wheatley et al. | |
| 2005/0133690 A1 | 6/2005 | Higashitsutsumi | |
| 2005/0133693 A1 | 6/2005 | Fourquet et al. | |
| 2005/0186754 A1 | 8/2005 | Kim | |
| 2005/0287479 A1 | 12/2005 | Moon | |
| 2006/0049533 A1 | 3/2006 | Kamoshita | |
| 2006/0147718 A1 | 7/2006 | Starkey | |
| 2006/0199105 A1 | 9/2006 | Cahill | |
| 2007/0072326 A1 | 3/2007 | Zheng et al. | |
| 2007/0238802 A1 | 10/2007 | Harada et al. | |
| 2007/0273781 A1 * | 11/2007 | Choe et al. | 348/311 |
| 2008/0135968 A1 * | 6/2008 | Kalnitsky et al. | 257/461 |
| 2008/0169524 A1 | 7/2008 | Kim | |
| 2008/0191298 A1 | 8/2008 | Lin et al. | |
| 2008/0237453 A1 * | 10/2008 | Chen et al. | 250/226 |
| 2009/0130398 A1 | 5/2009 | Irving et al. | |
| 2009/0236571 A1 | 9/2009 | Cohen | |

FOREIGN PATENT DOCUMENTS

| | | |
|---|---|---|
| EP | 0 877 426 A1 | 11/1998 |
| EP | 1 073 125 A2 | 1/2001 |
| JP | 2003-163344 | 6/2003 |
| JP | 2004-047544 | 2/2004 |
| WO | WO 99/50682 | 10/1999 |
| WO | WO 2006/003807 | 12/2006 |
| WO | WO 2008/097705 | 8/2008 |

OTHER PUBLICATIONS

Fukunaga, et al., "SI-OEIC (OPIC) for Optical Pickup," IEEE Transactions on Consumer Electronics, vol. 43, No. 2, May 1997, pp. 157-164.

Ghazi et al., "CMOS Photodiode with Enhanced Responsivity for the UV/Blue Spectral Range," IEEE Transactions on Electron Devices, vol. 49, No. 7, Jul. 2002, pp. 1124-1128.

Zimmerman et al., "Advanced Photo Integrated Circuits in CMOS Technology", 49th Electronic Components and Technology Conference, San Diego, Jun. 1-4, 1999, USA, pp. 1030-1035.

International Search Report for International Application No. PCT/US2008/051450 (May 20, 2008).

International Preliminary Report on Patentability for International Application No. PCT/US2008/051450, dated Apr. 30, 2009, 8 pages.

Windisch et al., "Large-Signal-Modulation of High-Efficiency Light-Emitting Diodes for Optical Communication"; IEEE Journal of Quantum Electronics, vol. 36, No. 12, Dec. 2000; pp: 1445-1453.

Bontems et al., "Synthesis and Properties of Monodisperse Polydimethylsiloxane Networks"; 907 Journal of Polymer Science Part A: Polymer Chemistry Edition Oct. 31, 1993, No. 11, New York, US; pp: 2697-2710.

Lalanne, P. et al., "CMOS Photodiodes Based on Vertical p-n-p Junctions," 11th International Parallel Processing Symposium, Apr. 1-5, 1997, Published by IEEE, 8 pages.

W. Zhang et al., "Performance of a CMOS Compatible Lateral Bipolar Photodetector on SOI Substrate," IEEE Electron Device Letts. 19(11):435-437 (1998).

M. Kuijk et al., "Spatially Modulated Light Detector in CMOS with Sense-Amplifier Receiver Operating at 180 Mb/s for Optical Data Link Applications and Parallel Optical Interconnects Between Chips," IEEE J. Selected Topics Quantum Electronics 4(6):1040-1045 (1998).

T.K. Woodward et al., "1-Gb/s Integrated Optical Detectors and Receivers in Commercial CMOS Technologies," IEEE J. Selected Topics Quantum Electronics 5(2):146-158 (1999).

C. Rooman et al., "Asynchronous 250-Mb/s Optical Receivers with Integrated Detector in Standard CMOS Technology for Optocoupler Applications," IEEE J. Solid-State Circuits 35(7):953-958 (2000).

"APC Amplifier with Integrated Photodetector for 24X CD-R and CD-RW Applications," Sipex SP8020, Sipex Corporation, 7 pp. Mar. 9, 2001.

"Photodetector Elements," 3 pp., http://www.iee.et.tu-dresden.de/iee/eb/analog/papers/mirrow/visionchip . . . / photodetector.htm, printed Oct. 24, 2002.

H. Zimmermann, ed., "Integrated Silicon Opto-electronics," Photonics pp. 4-6, 15-22, Springer.

Office Action mailed Jan. 31, 2013, in U.S. Appl. No. 12/885,138, filed Sep. 17, 2010.

Amendment dated Feb. 19, 2013, in U.S. Appl. No. 12/885,138, filed Sep. 17, 2010.

U.S. Appl. No. 13/717,080, filed Dec. 17, 2012.

Restriction Requirement mailed Dec. 28, 2012, in U.S. Appl. No. 12/885,138, filed Sep. 17, 2010.

Amendment filed Jan. 7, 2013, in U.S. Appl. No. 12/885,138, filed Sep. 17, 2010.

* cited by examiner

PHOTODETECTORS USEFUL AS AMBIENT LIGHT SENSORS HAVING AN OPTICAL FILTER REJECTING A PORTION OF INFRARED LIGHT

PRIORITY CLAIM

This application claims priority under 35 U.S.C. 119(e) to the following provisional patent applications, each of which is incorporated herein by reference: U.S. Provisional Patent Application No. 61/244,817, entitled WAFER-LEVEL COATING FOR AMBIENT SENSOR AND PROXIMITY SENSOR, filed Sep. 22, 2009; U.S. Provisional Patent Application No. 61/259,475, entitled OPTICAL SENSOR INCLUDING WAFER-LEVEL OPTICAL COATINGS AND TINTED PACKAGING EPOXY TO SHAPE SPECTRAL RESPONSE, filed Nov. 9, 2009; and U.S. Provisional Patent Application No. 61/257,595, entitled INFRARED SUPPRESSING PHOTO-PATTERNABLE COATING FOR PHOTODETECTING SEMICONDUCTOR DIE GLASS APPLICATIONS, filed Nov. 3, 2009.

BACKGROUND

Photodetectors can be used as ambient light sensors (ALSs), e.g., for use as energy saving light sensors for displays, for controlling backlighting in portable devices such as mobile phones and laptop computers, and for various other types of light level measurement and management. For more specific examples, ambient light sensors can be used to reduce overall display-system power consumption and to increase Liquid Crystal Display (LCD) lifespan by detecting bright and dim ambient light conditions as a means of controlling display and/or keypad backlighting. Without ambient light sensors, LCD display backlighting control is typically done manually whereby users will increase the intensity of the LCD as the ambient environment becomes brighter. With the use of ambient light sensors, users can adjust the LCD brightness to their preference, and as the ambient environment changes, the display brightness adjusts to make the display appear uniform at the same perceived level; this results in battery life being extended, user eye strain being reduced, and LCD lifespan being extended. Similarly, without ambient light sensors, control of the keypad backlight is very much dependent on the user and software. For example, keypad backlight can be turned on for 10 second by a trigger which can be triggered by pressing the keypad, or a timer. With the use of ambient light sensors, keypad backlighting can be turned on only when the ambient environment is dim, which will result in longer battery life. In order to achieve better ambient light sensing, ambient light sensors preferably have a spectral response close to the human eye response and have excellent infrared (IR) noise suppression.

SUMMARY

In accordance with an embodiment, a photodetector includes one or more first photodiode regions that are covered by an optical filter configured to reject infrared (IR) light and that produce a first current ($I_1$). The photodetector also includes one or more second photodiode regions that are covered by a light blocking material configured to reject visible and infrared light and that produce a second current ($I_2$). The photodetector also includes one or more third photodiode regions that are not covered by the optical filter and are not covered by the light blocking material and that produce a third current ($I_3$). Additionally, the photodetector includes circuitry configured to produce an output indicative of the first current ($I_1$) or a scaled version of the first current ($I_1$), minus the second current ($I_2$) or a scaled version of the second current ($I_2$), minus the third current ($I_3$) or a scaled version of the third current ($I_3$). In accordance with an embodiment, the one or more second photodiode regions that are covered by the light blocking material are also covered by the optical filter configured to reject IR light. The optical filter configured to reject IR light can be, e.g., a dielectric reflective optical coating filter, an IR absorption optical coating filter, or a combination thereof. The third current ($I_3$) (or the scaled version thereof) is at least one order of magnitude, and preferably at least two orders of magnitude, smaller than the first current ($I_1$) (or the scaled version thereof) from which the third current ($I_3$) (or the scaled version thereof) is being subtracted. This provides for significant improvement in IR rejection without much reduction in visible light response. This also means that the portion of the third current ($I_3$) (or the scaled version thereof) that is due to leakage current will be extremely small compared to the portions of the first and second currents (or scaled versions thereof) that are due to leakage current, and thus, that the portion of the third current ($I_3$) (or the scaled version thereof) that is due to leakage current can be ignored because it is so insignificant.

When light including visible light and IR light is incident on the photodetector, and a portion of the IR light passes through the optical filter: the first current ($I_1$) produced by the one or more first photodiode regions is primarily indicative of the visible light and a first fraction of the portion of the IR light that passes through the optical filter; the second current ($I_2$) produced by the one or more second photodiode regions is primarily indicative a second fraction of the portion of the IR light that passes through the optical filter; the third current ($I_3$) produced by the one or more third photodiode regions is primarily indicative of the visible light and the IR light; and the output produced by the circuitry is primarily indicative of the visible light with a majority of the IR light that passes through the optical filter subtracted out.

When no light is incident on the photodetector: the first current ($I_1$) produced by the one or more first photodiode regions is primarily indicative of a first leakage current; the second current ($I_2$) produced by the one or more second photodiode regions is primarily indicative of a second leakage current substantially equal to the first leakage current; and when the output is produced by the circuitry the second leakage current substantially cancels out the first leakage current such that the output produced by the circuitry is indicative of no light being detected.

In accordance with an alternative embodiment, a photodetector does not include any photodiode regions that are covered by a light blocking material. More specifically, the photodetector includes one or more photodiode regions that are covered by an optical filter configured to reject IR light and that produce a first current ($I_1$). Additionally, the photodetector includes one or more further photodiode regions that are not covered by the optical filter and that produce a further current ($I_3$). The photodetector also includes circuitry configured to produce an output indicative of the first current ($I_1$) or a scaled version of the first current ($I_1$), minus the further current ($I_3$) or a scaled version of the further current ($I_3$). The further current ($I_3$) (or the scaled version thereof) is at least one order of magnitude, and preferably at least two orders of magnitude, smaller than the first current ($I_1$) (or the scaled version thereof) from which the further current ($I_3$) (or the scaled version thereof) is being subtracted. This provides for significant improvement in IR rejection without much reduction in visible light response. When light including visible light and IR light is incident on the photodetector, and a portion of the IR light passes through the optical filter: the first current ($I_1$) produced by the one or more first photodiode regions is primarily indicative of the visible light and a fraction of the portion of the IR light that passes through the optical filter; the further current ($I_3$) produced by the one or more further photodiode regions is primarily indicative of the visible light and the IR light; and the output produced by the circuitry is primarily indicative of the visible light with a majority of the IR light that passes through the optical filter subtracted out.

Embodiments of the present invention are also directed to methods for producing outputs having a desired spectral response. In accordance with an embodiment, a first current ($I_1$) is produced that is primarily indicative of visible light and a first fraction of a portion of IR light that passes through an optical filter. Additionally, a second current ($I_2$) is produced that is primarily indicative a second fraction of the portion of the IR light that passes through the optical filter. Further, a third current ($I_3$) is produced that is primarily indicative of the visible light and the IR light. An output is produced that is indicative of the first current ($I_1$) or a scaled version of the first current ($I_1$), minus the second current ($I_2$) or a scaled version of the second current ($I_2$), minus the third current ($I_3$) or a scaled version of the third current ($I_3$), wherein the output is primarily indicative of the visible light with significantly all of the portion of the IR light that passes through the optical filter subtracted out.

In accordance with another embodiment, a first current ($I_1$) is produced that is primarily indicative of visible light and a first fraction of a portion of IR light that passes through an optical filter. Additionally, a further current ($I_3$) is produced that is primarily indicative of the visible light and the IR light. An output is produced that is indicative of the first current ($I_1$) or a scaled version of the first current ($I_1$), minus the further current ($I_3$) or a scaled version of the third current ($I_3$), wherein the output is primarily indicative of the visible light with significantly all of the portion of the IR light that passes through the optical filter subtracted out.

Further and alternative embodiments, and the features, aspects, and advantages of the embodiments of invention will become more apparent from the detailed description set forth below, the drawings and the claims.

DETAILED DESCRIPTION

Figure 1:
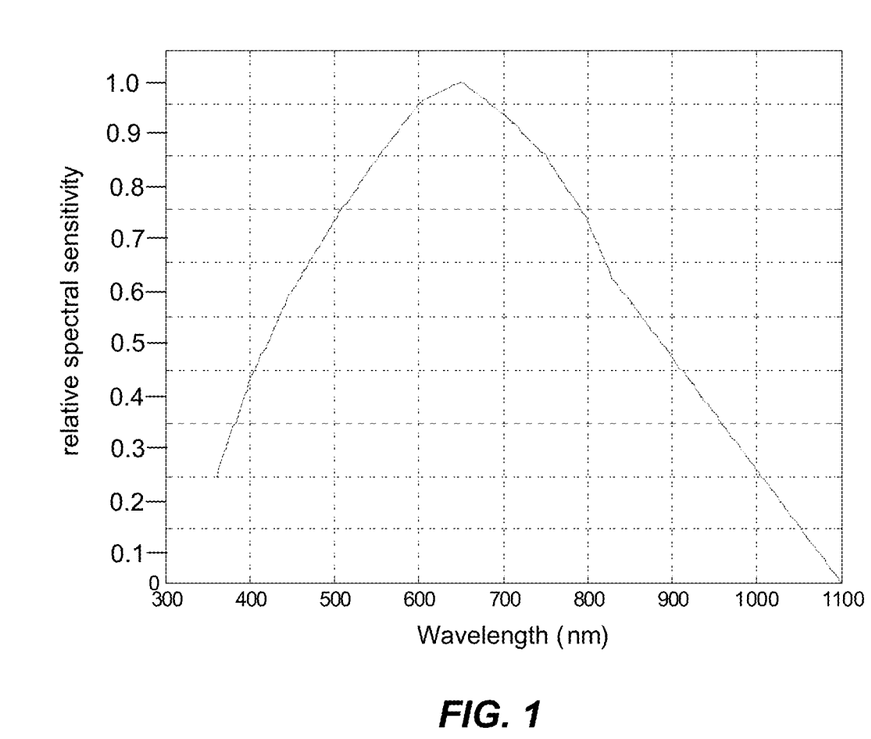
FIG. 1 illustrates an exemplary spectral response of a photodetector without any spectral response shaping.
Figure 2:
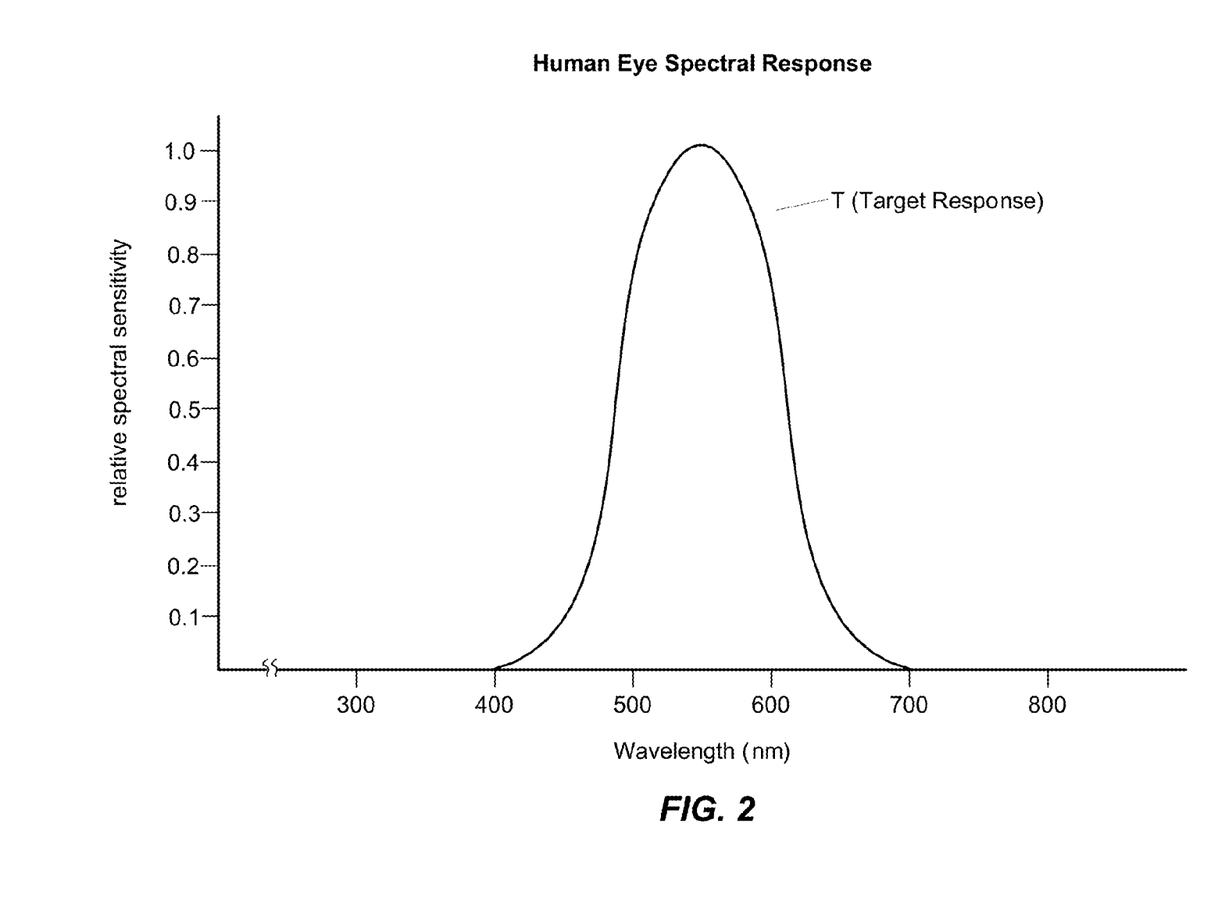
FIG. 2 illustrates the typical spectral response of a human eye.

FIG. 1 shows an exemplary spectral response of a photodetector without any spectral response shaping, e.g., using a filter covering the detector. FIG. 2 illustrates the typical spectral response of a human eye. As can be appreciated from FIGS. 1 and 2, a problem with using a photodetector as an ambient light sensor is that it detects both visible light and non-visible light, such as IR light, which starts at about 700 nm. By contrast, notice from FIG. 2 that the human eye does not detect IR light. Thus, the response of a photodetector can significantly differ from the response of a human eye, especially when the light is produced by an incandescent light, which produces large amounts of IR light. This would provide for significantly less than optimal adjustments if the photodetector were used as an ambient light sensor, e.g., for adjusting backlighting, or the like.

Another problem with using a photodetector as an ambient light sensor is that a photodetector will produce a relatively small electric current even when no light is incident upon the photodetector. This current, often referred to as a dark current or a leakage current, occurs due to the random generation of electrons and holes within depletion regions of a device that are then swept by a high electric field. This leakage or dark current also adversely affects that photodetector output when there are very low levels of light.

Figure 3A:
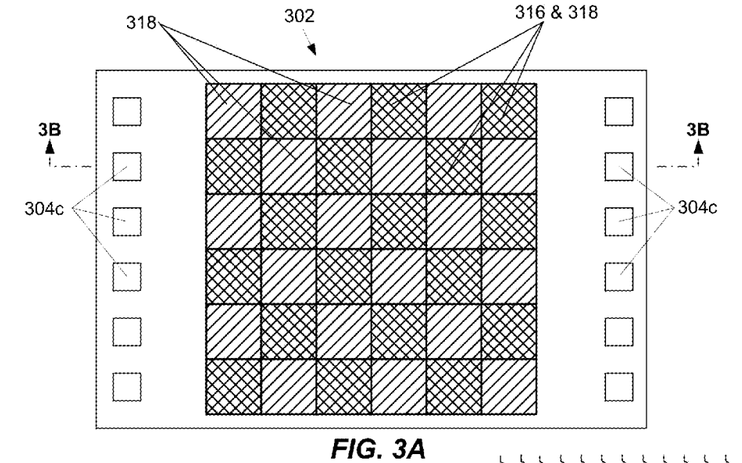
FIG. 3A illustrates a top view of a photodetector according to an embodiment of the present invention.
Figure 3B:
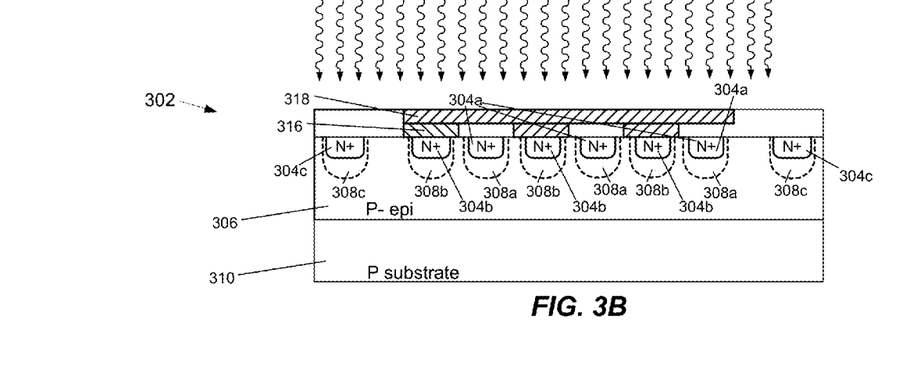
FIG. 3B illustrates a cross section of the photodetector of FIG. 3A along the line 3B-3B.

FIG. 3A illustrates a top view of a photodetector 302 according to an embodiment of the present invention. FIG. 3B illustrates a cross section of the photodetector 302 along the line 3B-3B shown in FIG. 3A. In the exemplary embodiment shown, the photodetector 302 includes an array of 8×6 photodiode regions. A sub-array of 6×6 photodiode regions are covered by an optical filter 318. More specifically, half of the sub-array of 6×6 photodiode regions are covered by the optical filter 318 and also by light blocking material 316, and the other half of the sub-array of 6×6 photodiode regions is covered by the optical filter 318 but not by the light blocking material 316. The remaining two sub-arrays of 1×6 photodiode regions (shown at the left and right of FIGS. 3A and 3B) are not covered by the optical filter 318 and are not covered by the light blocking material 316, and thus, can be referred to as uncovered photodiode regions or naked photodiode regions. The sizes of these arrays and sub-arrays are exemplary, and can be changed while still being within the scope of the present invention.

Referring to FIG. 3B, the photodetector 302 is formed on or within a substrate (e.g., a silicon wafer). In the embodiment shown, the photodetector 302 includes a plurality of $N^+$ regions 304 that are implanted in a $P^-$ epi region 306, which is grown on a P substrate 310. Each of the plurality of photodiode regions (forty eight photodiode regions in this example) is formed by a separate PN junction, each of which is reversed biased, thereby forming separate depletion regions 308. Preferably, the $P^-$ epi region 306 is very lightly doped. Placing the $N^+$ regions 304 in a $P^-$ epi region 306 provides improved quantum efficiency as compared to placing the $N^+$ regions 304 directly in the P substrate 310. However, although not preferred, embodiments of the present invention will also work where the $N^+$ regions 304 are placed directly in a P substrate.

The $N^+$ regions 304a are covered by the optical filter 318. The $N^+$ regions 304b are covered by both the light blocking material 316 and the optical filter 318. The $N^+$ regions 304c are neither covered by the light blocking material 316 nor the optical filter 318. While not shown, there can be thin oxide layer, e.g., silicon dioxide ($SiO_2$) covering the $N^+$ diffusion regions 304. Additionally, while not shown there can be various interlayer dielectric (ILD) layers, e.g., below and/or above the dielectric filter 318. Further, while not shown, the stack of materials can be capped with a top passivation coating.

In accordance with an embodiment, the light blocking material 316 is a metal or polysilicon layer. Alternatively, the light blocking material 316 can be made of other materials that will block the wavelengths of the light incident on the photodetector.

In accordance with an embodiment, the optical filter 318 is a dielectric reflective optical coating filter. The dielectric reflective optical coating filter can be constructed from thin layers of materials such as, but not limited to, zinc sulfide, magnesium fluoride, calcium fluoride, and various metal oxides (e.g., titanium dioxide), which are deposited onto the underlying optical substrate. By careful choice of the exact composition, thickness, and number of these layers, it is possible to tailor the reflectivity and transmissivity of the filter 318 to produce almost any desired spectral characteristics. For example, the reflectivity can be increased to greater than 99.99%, to produce a high-reflector (HR) coating. The level of reflectivity can also be tuned to any particular value, for instance to produce a mirror that reflects 90% and transmits 10% of the light that falls on it, over some range of wavelengths. Such mirrors have often been used as beam splitters, and as output couplers in lasers. Alternatively, the filter 318 can be designed such that the mirror reflects light only in a narrow band of wavelengths, producing a reflective optical filter.

High-reflection coatings work the opposite way to antireflection coatings. Generally, layers of high and low refractive index materials are alternated one above the other. Exemplary high refractive index materials include zinc sulfide (n=2.32) and titanium dioxide (n=2.4), and exemplary low refractive index materials include magnesium fluoride (n=1.38) and silicon dioxide (n=1.49). This periodic or alternating structure significantly enhances the reflectivity of the surface in the certain wavelength range called band-stop, which width is determined by the ratio of the two used indices only (for quarter-wave system), while the maximum reflectivity is increasing nearly up to 100% with a number of layers in the stack. The thicknesses of the layers are generally quarter-wave (then they yield to the broadest high reflection band in comparison to the non-quarter-wave systems composed from the same materials), designed such that reflected beams constructively interfere with one another to maximize reflection and minimize transmission. Using the above described structures, high reflective coatings can achieve very high (e.g., 99.9%) reflectivity over a broad wavelength range (tens of nanometers in the visible spectrum range), with a lower reflectivity over other wavelength ranges, to thereby achieve a desired spectral response. By manipulating the exact thickness and composition of the layers in the reflective stack, the reflection characteristics can be tuned to a desired spectral response, and may incorporate both high-reflective and anti-reflective wavelength regions. The coating can be designed as a long-pass or short-pass filter, a bandpass or notch filter, or a mirror with a specific reflectivity.

In accordance with specific embodiments of the present invention, the photodetector 302 is designed such that its output has a spectral response that is similar to that of a typical human eye response (shown in FIG. 2). For the remainder of this discussion, unless stated otherwise, it will be assumed that the photodetector 302 is designed such that its output has a spectral response that is similar to that of a typical human eye response (i.e., similar to the spectral response shown in FIG. 2).

While not specifically shown, the $N^+$ regions 304a covered by the optical filter 318 (but not by the light blocking material 316) are electrically connected together in an embodiment and produce a first current ($I_1$), which is indicative of light (if any) incident on the $N^+$ regions 304a and a leakage current. In accordance with an embodiment, the optical filter 318 is designed to pass visible light and reject (e.g., reflect) IR light. Nevertheless, some IR light will still passes through the optical filter 318. Accordingly, when light including visible light and IR light is incident on the photodetector 302, the portion of the light incident on the $N^+$ regions 304a will include both visible light, as well as some IR light that passes through the optical filter 318. Thus, when light including visible light and IR light is incident on the photodetector 302, the first current ($I_1$) will be indicative of visible light, a small portion of IR light that passes through the optical filter 318, and a small leakage current.

While not specifically shown, the $N^+$ regions 304b covered by both the light blocking material 316 and the optical filter 318 are electrically connected together in an embodiment and produce a second current ($I_2$), which is indicative of a fraction of the IR light (if any) that penetrates deep into to the $P^-$ epi region 306, as will be explained in some more detail below, and a small leakage current. This second current ($I_2$) is substantially unaffected by visible light.

When light including visible light and IR light is incident on the photodetector, one or more of the naked $N^+$ regions 304c produce a third current ($I_3$), which is indicative of visible light, IR light, and a small leakage current.

Additional details of how the first and second currents ($I_1$ and $I_2$) are generated and how they can be used are now provided. Thereafter, additional details of how the third currents ($I_3$) is generated and how it can be used is provided.

Still referring to FIG. 3B, when light is incident on the photodetector 302, carriers are not generated in the depletion regions 308b corresponding to $N^+$ 304b regions covered by both the light blocking material 316 and the reflective filter 318, because no light is incident on $N^+$ regions 304b covered by the light blocking material 316. The light incident on $N^+$ regions 304a that are covered by reflective filter 318 (but not covered by the light blocking material 316) generate carriers in the corresponding depletion regions 308a, which are quickly captured in the $N^+$ regions 304a which are electrically connected together. However, the slow carriers generated below the depletion regions 308a (due to long wavelength IR light that penetrates deeply into to the $P^-$ epi region 306) wander around for a while before eventually entering an electric field and then getting captured. After wandering around (e.g., in a left or right direction), some of the slow carriers will eventually be captured by one of the $N^+$ regions 304b covered by the light blocking material 316. In fact, about half of the slow carriers are eventually captured by the $N^+$ regions 304b covered by the light blocking material 316 and the other half are captured by $N^+$ regions 304a not covered by the light blocking material 316. This half and half capture is due to the substantially random behavior of the slow carriers, the similar shape of each $N^+$ region 304a and 304b, the fact that a layout area associated with the $N^+$ regions 304a is substantially equal to a layout area associated with the $N^+$ regions 304b, and the substantially identical biasing of each PN junction.

The carriers that are captured by the $N^+$ regions 304a that are only covered by reflective filter 318 (but not covered by the light blocking material 316) produce the first current ($I_1$), a majority of which is created immediately by the quickly captured carriers (also referred to as fast carriers). A small portion of the first current ($I_1$) is due to later captured slow carriers, and a further small portion of the first current ($I_1$) is also due to leakage current.

The carriers captured by the $N^+$ regions 304b, covered by both the light blocking material 316 and the reflective filter 318, produce the second current ($I_2$), a portion of which is a deferred current produced by later (i.e., deferred) captured slow carriers, and a portion of which is leakage current.

When light is incident on the photodetector 302, the portions of first current ($I_1$) and the second current ($I_2$) that are due to leakage current are relatively small compared to the portions of due to visible light and/or IR light. However, when light is not incident (or only a very low level of light is incident) on the photodetector 302, significant portions of the first current ($I_1$) and the second current ($I_2$) are primarily indicative of leakage current. By subtracting the second current ($I_2$) from the first current ($I_1$), the leakage currents should cancel each other out.

Figure 4A:
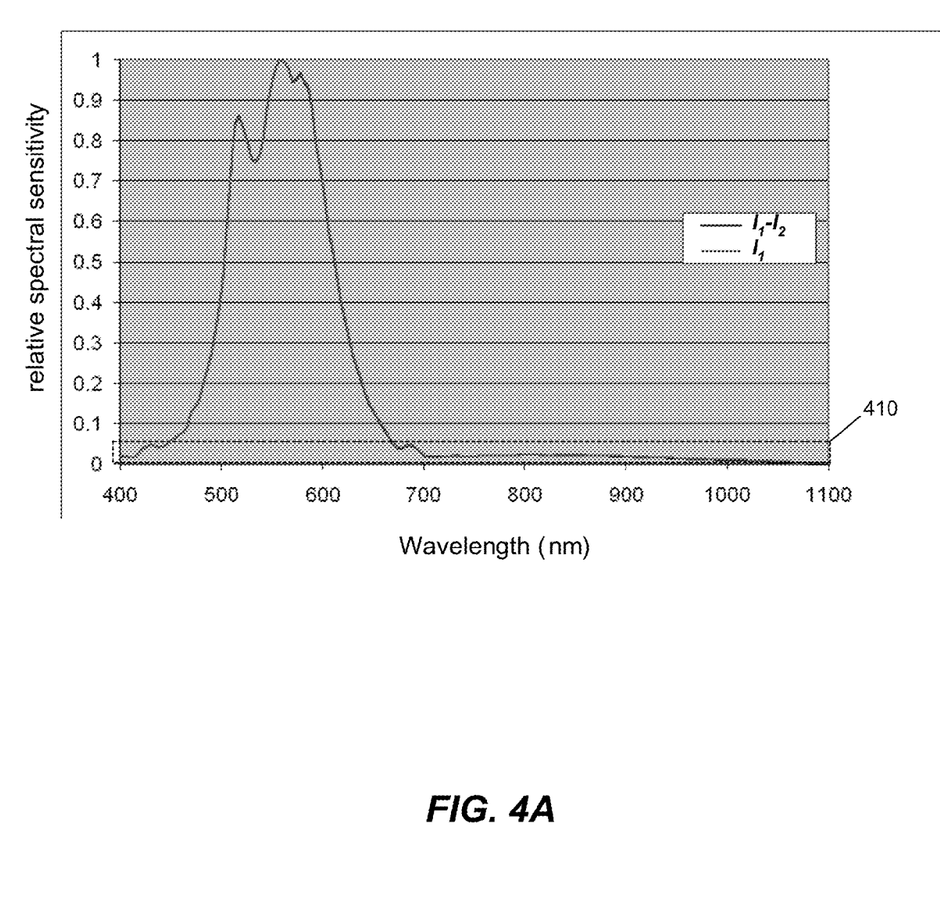
FIG. 4A is a graph that illustrates exemplary spectral responses that can be achieved using the photodetector of FIGS. 3A and 3B.
Figure 4B:
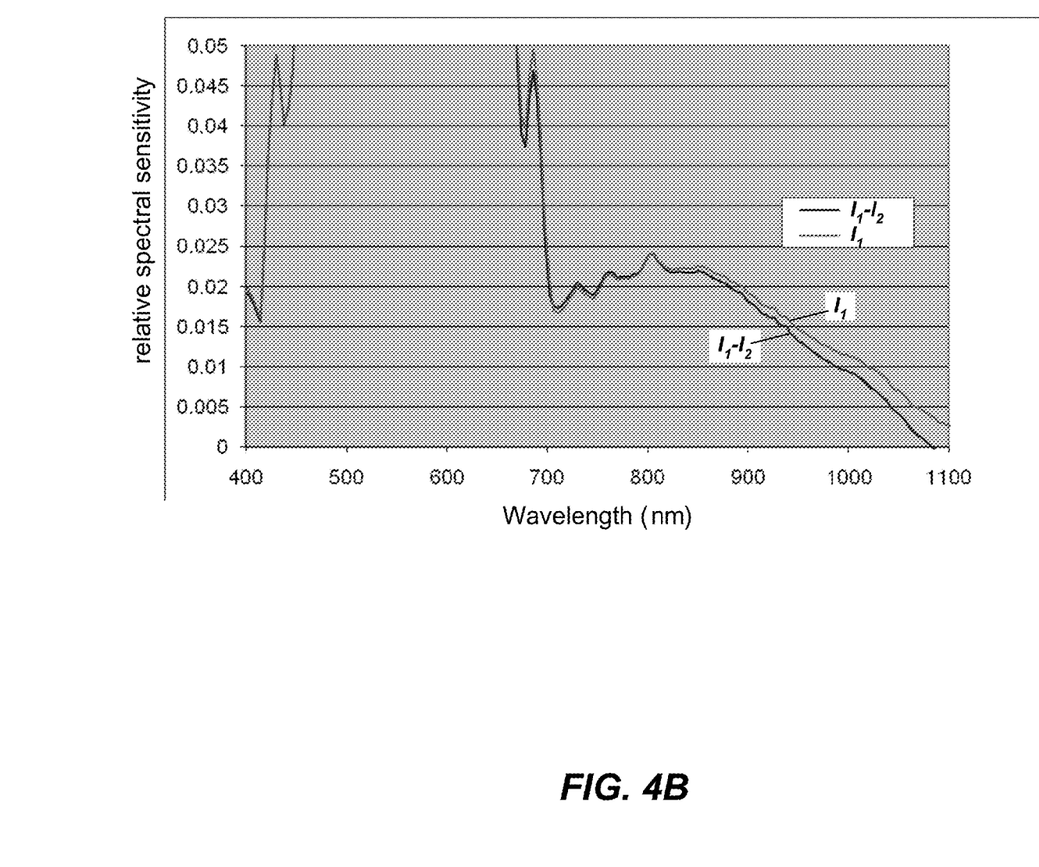
FIG. 4B is a graph that illustrates additional details of a portion of the graph of FIG. 4A.

Referring back to FIG. 2, the human eye response, which is the target response for an ambient light sensor, is from about 400 nm to about 700 nm, with the peak spectral response of the human eye at about 555 nm. FIG. 4A is an exemplary graph showing a spectral response corresponding to the first current ($I_1$), as well as a spectral response corresponding to the first current ($I_1$) minus the second current ($I_2$), when light is incident on the photodetector 302. FIG. 4B is a graph that illustrates additional details of a portion 410 of the graph of FIG. 4A. Comparing FIGS. 4A and 4B to FIG. 2, it can be appreciated that when light is incident on the photodetector 302 the spectral response corresponding to the first current ($I_1$), as well as the spectral response corresponding to the first current ($I_1$) minus the second current ($I_2$), is affected by IR light above 700 nm. In other words, above 700 nm the spectral response corresponding to the first current ($I_1$), as well as the spectral response corresponding to the first current ($I_1$) minus the second current ($I_2$), differs more than desired from the target spectral response of FIG. 2. Because the slow carriers will be canceled out when subtracting the second current ($I_2$) from the first current ($I_1$), it can be appreciated from FIG. 4B, that the response for the first current ($I_1$) minus the second current ($I_2$) is slightly closer to the desired spectral response than the spectral response for the first current ($I_1$) alone.

As will now be explained, in accordance with specific embodiments of the present invention, a spectral response closer to a target response (e.g., a human eye response) can be achieve by subtracting at least a portion of a third current ($I_3$) from the from the first current ($I_1$) minus the second current ($I_2$), or just from the first current ($I_1$).

Referring back to FIGS. 3A and 3B, when light is incident on the photodetector 302, one or more of the $N^+$ regions 304c (that are neither covered by the light blocking material 316 nor by the optical filter 318) produce the third current ($I_3$), which is indicative of visible light, IR light, and a small leakage current. As was the case with the first and second currents ($I_1$ and $I_2$), when light is incident on the photodetector 302, the portion of the third current ($I_3$) due to leakage current is very small. An exemplary spectral response corresponding to the first current ($I_3$) is the spectral response shown in FIG. 1. Notice from FIG. 1 that the spectral response corresponding to the first current ($I_3$) is significantly affected by IR light above 700 nm.

Figure 5A:
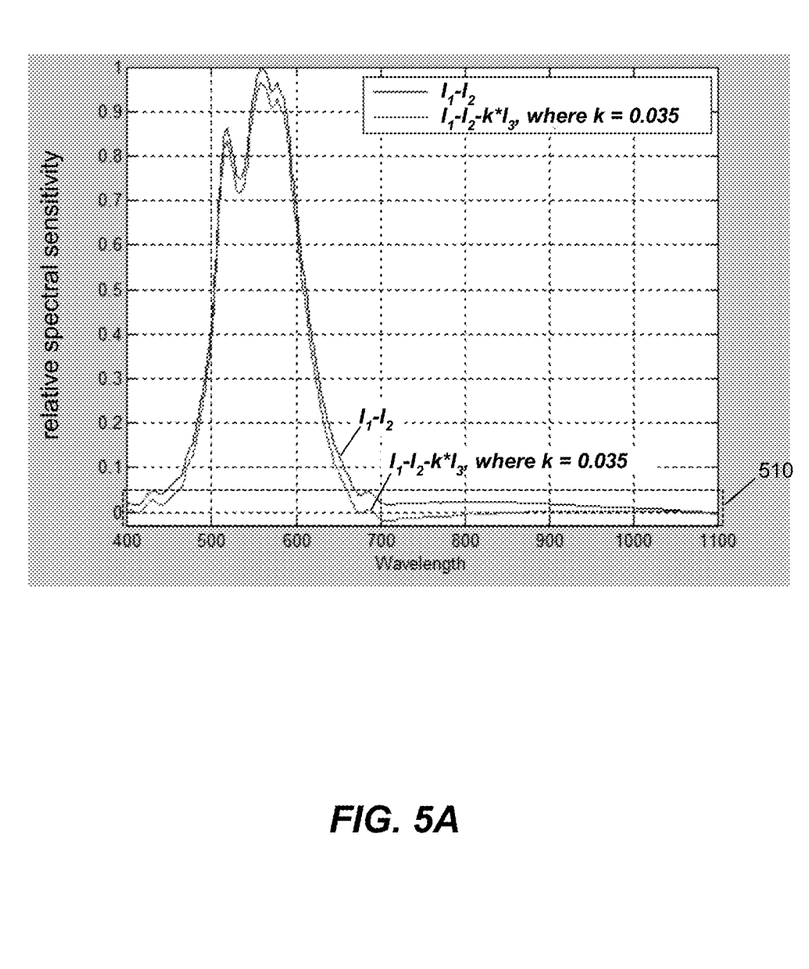
FIG. 5A is a further graph that illustrates exemplary spectral responses that can be achieved using the photodetector of FIGS. 3A and 3B.
Figure 5B:
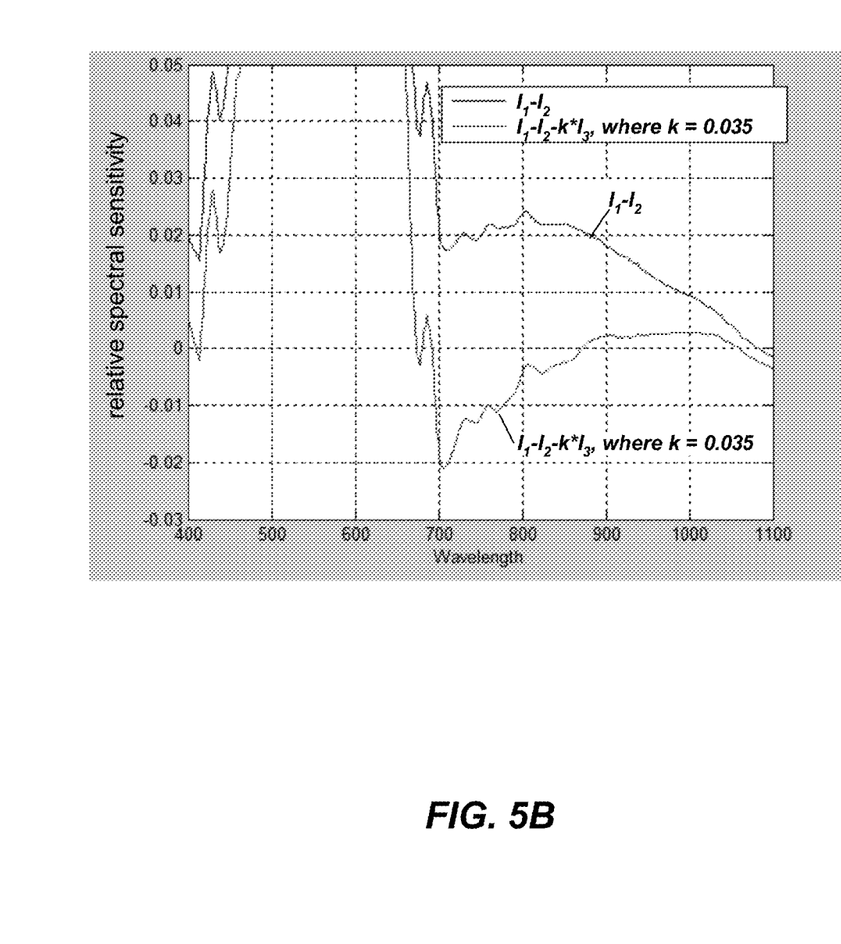
FIG. 5B is a graph that illustrates additional details of a portion of the graph of FIG. 5A.

FIG. 5A is an exemplary graph showing a spectral response corresponding to the first current ($I_1$) minus the second current ($I_2$), as well as a spectral response corresponding to the first current ($I_1$) minus the second current ($I_2$) minus a scaled version of the third current ($I_3$) (e.g., $k*I_3$, where $k=0.035$) when light is incident on the photodetector 302. FIG. 5B is a graph that illustrates additional details of a portion 510 of the graph of FIG. 5A. Comparing FIGS. 5A and 5B to FIG. 2, it can be appreciated that when light is incident on the photodetector 302 the spectral response corresponding to the first current ($I_1$) minus the second current ($I_2$) minus a scaled version of the third current ($I_3$) is closer to the target response of FIG. 2 than the spectral response corresponding to the first current ($I_1$) minus the second current ($I_2$).

FIGS. 5A and 5B illustrate that IR rejection can be significantly improved without much reduction in visible light response, because the third current ($I_3$) used in the subtraction is significantly smaller than first current ($I_1$). The third current ($I_3$) (or the scaled version thereof) is at least one order of magnitude, and preferably at least two orders of magnitude, smaller than the first current ($I_1$) (or the scaled version thereof) from which the third current ($I_3$) (or the scaled version thereof) is being subtracted. This provides for significant improvement in IR rejection without much reduction in visible light response. This also means that the portion of the third current ($I_3$) (or the scaled version thereof) that is due to leakage current will be extremely small compared to the portions of the first and second currents (or scaled versions thereof) that are due to leakage current, and thus, that the portion of the third current ($I_3$) (or the scaled version thereof) that is due to leakage current can be ignored because it is so insignificant. The precise amount of the third current ($I_3$) from which to subtract from the first current ($I_1$) (or a scaled version thereof) can be determined using simulations and/or empirically. For example, the scaling factor (k) for the third current ($I_3$) can be determined using simulations and/or empirically.

Figure 6A:
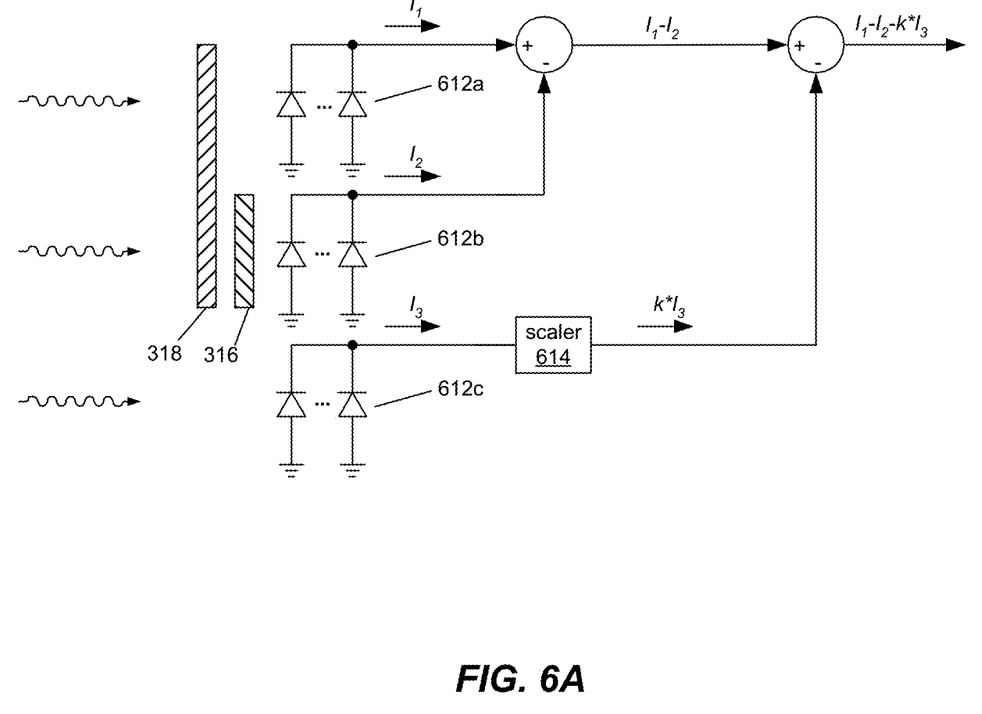
FIGS. 6A and 6B are high level diagrams used to illustrate how currents and/or other signals can be combined in accordance with specific embodiments of the present invention.
Figure 6B:
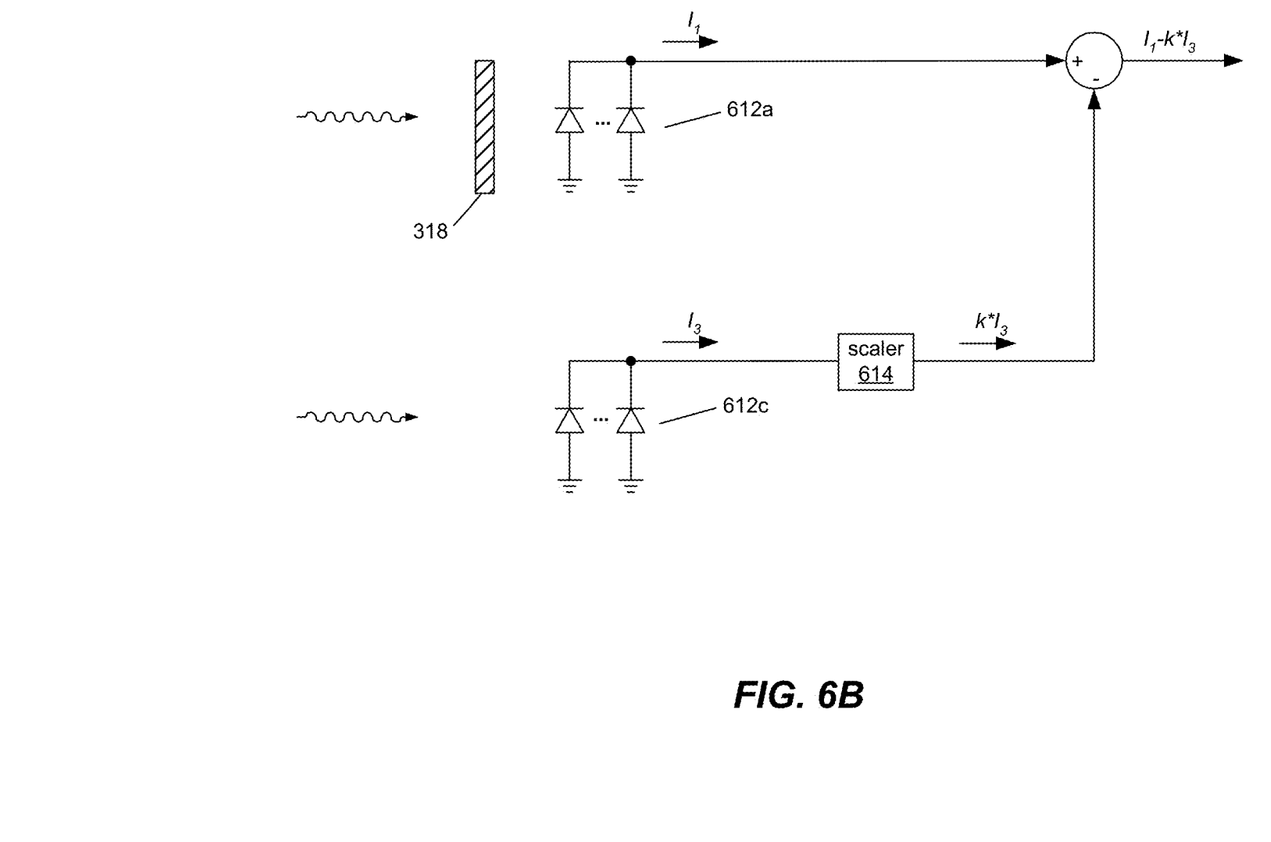

FIGS. 6A and 6B are high level diagrams used to illustrate how currents and/or other signals can be combined in accordance with specific embodiments of the present invention. In these figures, a generic block 614 shown as a "scaler" is shown in only one of the signal paths, but can be in additional or alternative signal paths. Such a scaler can be used to trim or amplify a signal, as will be explained in more detail below. There is various types of well known circuitry that can be used to subtract currents and/or other types of signals. For example, differential input amplifiers can be used to determine the difference between two signals. For another example, current mirrors can be used to perform subtractions. These are just a few examples, which are not meant to be limiting.

Referring to FIG. 6A, one or more photodiode regions 612a are covered by the optical filter 318 configured to reject IR wavelengths and produce the first current ($I_1$). Referring back to FIGS. 3A and 3B, each photodiode region 612a in FIG. 6A can correspond to a PN junction formed by an $N^+$ diffusion region 304a and the underlying P type surface region 306, where the N+ diffusion region 304a is covered by the optical filter 318 but not covered by the light blocking material 316. Referring again to FIG. 6A, one or more photodiode regions 612b are covered by the light blocking material 316 and the optical filter 318 configured to reject IR wavelengths and produce the second current ($I_2$). Referring back to FIGS. 3A and 3B, each photodiode region 612b in FIG. 6A can correspond to a PN junction formed by an $N^+$ diffusion region 304b and the underlying P type surface region 306, where the N+ diffusion region 304b is covered by the optical filter 318 and the light blocking material 316. Referring again to FIG. 6A, one or more photodiode regions 612c are not covered by the light blocking material 316 and not covered the optical filter 318 configured to reject IR wavelengths and produce the third current ($I_3$). Referring back to FIGS. 3A and 3B, each photodiode region 612c in FIG. 6A can correspond to a PN junction formed by an N+ diffusion region 304c and the underlying P type surface region 306, where the N+ diffusion region 304c is not covered by the optical filter 318 and not covered by the light blocking material 316.

The major benefit of subtracting out the second current ($I_2$), produced by the one or more photodiode regions covered by the light blocking material 316, is to cancel out leakage currents (also referred to as dark currents). Such dark currents may not be significant problem where a photodetector is typically used at or close to room temperature, but rather typically becomes more of a problem at higher temperatures. As can be appreciated from FIGS. 3A and 3B, a significant portion of the photodetector 302 is shown as being covered by the light block material 316 and devoted to producing the second current ($I_2$). Accordingly, if there is a desire to reduce the size and cost of the photodetector, and dark currents are not a significant concern (e.g., because it is expected that the photodetector will be used at temperatures close to room temperature), the photodiode regions covered by a light blocking material 316 can be eliminated. In other words, in accordance with certain embodiments of the present invention, a photodetector can include one or more photodiode regions 602a covered by the optical filter 318 configured to reject IR light and one or more photodiode regions 602c not covered by the optical filter 318 (without any photodiode regions covered by a light blocking material). In such embodiments, the output of the photodetector can have a spectral response corresponding to the first current ($I_1$) minus a scaled version of the third current ($I_3$). This can be appreciated from FIG. 6B. Further, the structure of the photodetector 302 shown in FIGS. 3A and 3B can be simplified for such embodiments.

In FIG. 3B (and later in FIG. 6A) the optical filter 318 is shown as being above the light blocking material 316. This order can be reversed so that the optical filter 318 is below the light blocking material 316.

In the above described embodiments, the one or more photodiode regions 612b that are covered by the light blocking material 316 are also described and shown as being covered by the optical filter 318 configured to reject IR light. As can be appreciated from FIGS. 3A and 3B, this is a practical way of fabricating the photodetector 302, especially where photodiode regions 612a and 612b are interlaced in a checkerboard pattern, as shown in FIG. 3A. However, it is noted that it is not necessary that the photodiode regions 612b that are covered by the light blocking material 316 also be covered by the optical filter 318, since for these photodiode regions 612b the light that passes through the filter 318 will eventually get blocked by the light block material 316 and will not reach the photodiode region 612b anyway.

In accordance with specific embodiments, the optical filter 318 is a dielectric reflective optical coating filter, exemplary details of which were discussed above. Alternative, or additionally, the optical filter 318 can be (or include) an IR absorption type filter, which can include one or more colorants, e.g., pigments or/or dyes that absorb IR light and pass visible light. For example, a green pigment provides a first approximation to a standard human eye spectral response, since green is dominant in human vision. Dyes have been developed that pass light in the visible spectrum (e.g., from about 400 to 700 nm) and absorb light in the IR spectrum. Such dyes have been, e.g., added to a transparent plastic to provide a transparent credit card that absorbs IR light, e.g., so a credit card machine can use IR light to determine whether a credit card has been inserted into a credit card reader. Such dyes are available, e.g., from Epolin, Inc, of Newark, N.J. For example, Epolight E8316 is an example die available from Epolyn, Inc. Exemplary chemical formulas for such dyes are disclosed, e.g., in U.S. Pat. No. 5,656,639 and U.S. Patent Publication No. 2009/0236571, both of which are assigned to Epolin, Inc., both of which are incorporated herein by reference. In accordance with specific embodiments of the present invention, such a dye is added to a carrier material to provide a photo-patternable dyed coating that is used to provide the optical filter 318. The dyed coating can comprise a visible light passing carrier material to which is added a dye that absorbs IR light and passes visible light. The carrier material can be a negative photoresist material, an epoxy material or a filter material, but is not limited thereto. Such a carrier material can be clear, but alternatively could include a colored tint.

In the above described embodiments, the various currents that are produced can be scaled (e.g., amplified or trimmed) before and/or after being combined to produce an output (e.g., an output current). It is also possible that currents are converted to voltages and that signals are scaled in the voltage domain and then converted back to currents before being combined to produce an output. Alternatively, signals can be combined in the voltage domain. One of ordinary skill in the art will appreciate that many other ways for adjusting currents and/or voltages are within the spirit and scope of the present invention. For example, programmable devices (e.g., a programmable digital-to-analog converter (DAC)) can be used to appropriately adjust voltages and/or currents. An advantage of using a programmable device is that it may selectively adjust the appropriate gain(s) based on additional variables, such as temperature. It is also noted that current signals or voltage signals can be converted into the digital domain and all further processing of these signals (e.g., scaling of one or more signals and determining a difference between signals) can be performed in the digital domain, rather than using analog components. Such digital domain processing can be performed using dedicated digital hardware or on a general purpose processor, such as a microprocessor.

Another way to scale currents is to selectively connect similar photodiode regions in a programmable manner. For example, rather than having all of the photodiode regions 612c permanently connected together to produce the third current ($I_3$), individual photodiode regions 612c can be selected, using individual switches (e.g., implemented using transistors), to contribute to the third current ($I_3$). Accordingly, if only one of the photodiode regions 612c is selected to contribute to the third current ($I_3$) then the third current ($I_3$) would be approximately $1/12^{th}$ that magnitude than if twelve photodiode regions 612c were selected to contribute to the third current ($I_3$). This provides a relative inexpensive and power efficient technique for scaling the third current ($I_3$) relative to the first and second currents ($I_1$) and ($I_2$). The first and second currents ($I_1$) and ($I_2$) can also be scalable in a similar manner, if desired.

Since the magnitude of the third current ($I_3$) produced using one or more naked photodiode regions 612c should be significantly smaller than the first current ($I_1$), at least one order of magnitude smaller, and likely at least two orders of magnitude smaller, the area of the photodetector 302 devoted to producing the third current ($I_3$) can be significantly smaller than the area devoted to producing the first current ($I_1$). For example, referring back to FIGS. 3A and 3B, there can be significantly less N+ diffusion regions 304c compared to N+ diffusion regions 304*a*. Also, the size of each N+ diffusion regions 304*c* can be smaller than the size of the N+ diffusion regions 304*a*.

In the embodiments described above, the target response was often described as being similar to that of a typical human eye viewing diffused light. However, that need not be the case. For example, other target responses can be for the photodetector (or a portion thereof) can be to detect light of a specific color, such as red, green or blue. Such photodetectors can be used, e.g., in digital cameras, color scanners, color photocopiers, and the like. In these embodiments, the optical filter 318 can be optimized for the specific color to be detected, and can be used alone or in combination with the various techniques for filtering out IR light that happens to make it through the dielectric filter 318. For example, one or more photodiode regions can be optimized to detect green light, one or more further photodiode regions can be optimized to detect red light, and one or more further photodiode regions can be optimized to detect blue light. Using techniques described above, leakage current and/or IR light detected by the regions can be substantially canceled out, e.g., using photodiode regions covered by a light blocking material and/or photodiode regions not covered by an optical filter and not covered by a light blocking material.

In the above described embodiments, N type regions are described as being implanted in a P type region. For example, the N+ diffusion region 304 is implanted in P⁻ region 306. In alternative embodiments, the semiconductor conductivity materials are reversed. That is, P type regions can be implanted in an N type region. For a specific example, a heavily doped P⁺ region is implanted in a lightly doped N⁻ region, to form the active photodiode region.

Certain embodiments of the present invention are also directed to methods of producing photocurrents that are primarily indicative of target wavelengths of light, e.g., wavelengths of visible light. In other words, embodiments of the present invention are also directed to methods for providing a photodetector having a target spectral response, such as, a response similar to that of the human eye. Additionally, embodiments of the present invention are also directed to methods of using the above described photodetector.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A photodetector configured for use as an ambient light sensor (ALS) having a spectral response similar to that of a human eye, comprising:
   one or more first photodiode regions that are covered by an optical filter configured to reject infrared (IR) light and that produce a first current ($I_1$);
   one or more second photodiode regions that are covered by a light blocking material configured to reject visible and IR light and that produce a second current ($I_2$);
   one or more third photodiode regions that are not covered by the optical filter configured to reject IR light and are not covered by the light blocking material and that produce a third current ($I_3$); and
   circuitry configured to produce an output indicative of the first current ($I_1$) or a scaled version of the first current ($I_1$), minus the second current ($I_2$) or a scaled version of the second current ($I_2$), minus the third current ($I_3$) or a scaled version of the third current ($I_3$);
   wherein when light including visible light and IR light is incident on the photodetector
      a portion of the IR light passes through the optical filter configured to reject IR light,
      the first current ($I_1$) produced by the one or more first photodiode regions is primarily indicative of the visible light and a first fraction of the portion of the IR light that passes through the optical filter,
      the second current ($I_2$) produced by the one or more second photodiode regions is primarily indicative a second fraction of the portion of the IR light that passes through the optical filter,
      the third current ($I_3$) produced by the one or more third photodiode regions is primarily indicative of both the visible light and the IR light, and
      the output produced by the circuitry is primarily indicative of the visible light with a majority of the IR light that passes through the optical filter subtracted out, and thus has a spectral response similar to that of a human eye, thereby enabling the photodetector to be used as an ALS.

2. The photodetector of claim 1, wherein the one or more second photodiode regions that are covered by the light blocking material are also covered by the optical filter configured to reject IR light.

3. The photodetector of claim 1, wherein when no light is incident on the photodetector:
   the first current ($I_1$) produced by the one or more first photodiode regions is primarily indicative of a first leakage current;
   the second current ($I_2$) produced by the one or more second photodiode regions is primarily indicative of a second leakage current substantially equal to the first leakage current; and
   when the output is produced by the circuitry the second leakage current substantially cancels out the first leakage current such that the output produced by the circuitry is indicative of no light being detected.

4. The photodetector of claim 1, wherein the optical filter configured to reject IR light comprises a dielectric reflective optical coating filter and an IR absorption optical coating filter.

5. The photodetector of claim 1, wherein the optical filter configured to reject IR light comprises a dielectric reflective optical coating filter.

6. The photodetector of claim 1, wherein the optical filter configured to reject IR light comprises an IR absorption optical coating filter.

7. The photodetector of claim 1, wherein a magnitude of the one of the third current ($I_3$) or the scaled version of the third current ($I_3$), which is subtracted by the circuitry, is at least one order of magnitude smaller than the one of the first current ($I_1$) or the scaled version of the third current ($I_3$), from which the one of the third current ($I_3$) or the scaled version of the third current ($I_3$) is subtracted by the circuitry.

8. A method for use by a photodetector including one or more first photodiode regions that are covered by an optical filter configured to reject infrared (IR) light, one or more second photodiode regions that are covered by a light blocking material configured to reject visible and IR light, and one or more third photodiode regions that are not covered by the optical filter configured to reject IR light and are not covered by the light blocking material, wherein the method is for producing an output having a spectral response similar to that of a human eye when light including visible light and IR light is incident on the photodetector, the method comprising: (a) using the one or more first photodiode regions that are covered by the optical filter configured to reject IR light, producing a first current (I1) primarily indicative of visible light and a first fraction of a portion of infrared (IR) light that passes through the optical filter; (b) using the one or more second photodiode regions that are covered by the light blocking material configured to reject visible and IR light, producing a second current (I2) primarily indicative a second fraction of the portion of the IR light that passes through the optical filter; (c) using the one or more third photodiode regions that are not covered by the optical filter and are not covered by the light blocking material, producing a third current (I3) primarily indicative of the visible light and the IR light; and (d) producing an output indicative of the first current (I1) or a scaled version of the first current (I1), minus the second current (I2) or a scaled version of the second current (I2), minus the third current (I3) or a scaled version of the third current (I3), wherein the output is primarily indicative of the visible light with significantly all of the portion of the IR light that passes through the optical filter subtracted out, thereby causing the output to have a spectral response similar to that of a human eye.

9. The method of claim 8, wherein:
step (d) is performed using circuitry configured to subtract from first current ($I_1$) or a scaled version of the first current ($I_1$), the second current ($I_2$) or a scaled version of the second current ($I_2$), and the third current ($I_3$) or a scaled version of the third current ($I_3$).

10. The method of claim 8, wherein the optical filter comprises a dielectric reflective optical coating filter.

11. The method of claim 8, wherein the optical filter comprises an IR absorption optical coating filter.

12. The method of claim 8, wherein a magnitude of the one of the third current ($I_3$) or the scaled version of the third current ($I_3$), which is subtracted at step (d), is at least one order of magnitude smaller than the one of the first current ($I_1$) or the scaled version of the first current ($I_1$), from which the one of the third current ($I_3$) or the scaled version of the third current ($I_3$) is subtracted at step (d).

* * * * *

UNITED STATES PATENT AND TRADEMARK OFFICE
CERTIFICATE OF CORRECTION

PATENT NO.         : 8,492,699 B2
APPLICATION NO.    : 12/885297
DATED              : July 23, 2013
INVENTOR(S)        : Zheng et al.

Page 1 of 1

It is certified that error appears in the above-identified patent and that said Letters Patent is hereby corrected as shown below:

In the Claims

Col. 12, line 56: After "the" and before "current" delete "third" and insert -- first --

Col. 12, line 56: After "current" and before "from" delete "($I_3$)," and insert -- ($I_1$), --

Signed and Sealed this
Twenty-third Day of December, 2014

Michelle K. Lee
*Deputy Director of the United States Patent and Trademark Office*